United States Patent [19]

Sullivan

[11] Patent Number: 5,455,845
[45] Date of Patent: Oct. 3, 1995

[54] MICROWAVE RECEIVER HAVING COHERENT THRESHOLD DETECTION

[75] Inventor: William B. Sullivan, Verona, N.J.

[73] Assignee: Wide Band Systems,i Inc., Franklin, N.J.

[21] Appl. No.: 165,268

[22] Filed: Dec. 10, 1993

[51] Int. Cl.$^6$ .............................. H04L 25/00; H04L 27/00
[52] U.S. Cl. ........................... 375/317; 375/322; 375/324
[58] Field of Search ..................................... 375/271, 316, 375/317, 318, 322, 324, 325, 326; 455/205, 226.3

[56] References Cited

U.S. PATENT DOCUMENTS

| | | | |
|---|---|---|---|
| 4,871,975 | 10/1989 | Nawata et al. | 375/326 |
| 5,268,647 | 12/1993 | Ichiyoshi | 375/325 |
| 5,345,187 | 9/1994 | McGuire | 375/324 |

Primary Examiner—Stephen Chin
Assistant Examiner—Don N. Vo

[57] ABSTRACT

A circuit arrangement is disclosed that performs one or all of the functions selected from the group comprising (1) establishing a threshold level for detecting and encoding selected parameters of RF signals; (2) establishes a threshold level that corresponds to a signal-to-noise ratio (SNR) and which is used for detecting and encoding selected parameters of RF signals; and (3) determining the tangent angle of the received RF signals which is further used for measuring the frequency of the RF signal. The circuit arrangement comprises a microwave correlator including a power divider, a delay line, a quadrature coupler, and two multipliers. The circuit arrangement further comprises an RF amplifier, a bandpass filter, low pass filters, analog-to-digital converters, and preferably a PROM. The microwave correlator splits the RF signals between two paths, with one path being delayed with respect to the other, and then multiplies delayed RF signals with the undelayed RF signals to provide a video signal containing both sine and cosine information. The sine and cosine information are converted to digital representations which are used to provide any of the three features of the present invention.

18 Claims, 3 Drawing Sheets

MICROWAVE RECEIVER HAVING COHERENT THRESHOLD DETECTION

FIELD OF THE INVENTION

The present invention relates to a microwave receiver having a circuit arrangement that provides a desired threshold level used to start the operation of detecting and encoding selected parameters of received RF signals. More particularly, the present invention relates to a circuit arrangement having a microwave correlator that divides the RF input signals into two different paths, with one of the paths being delayed with respect to the other, multiplies the delayed RF and undelayed RF signals to develop sine and cosine quantities that are exploited to establish the desired threshold level, the desired threshold level that is dependent upon the signal-to-noise ratio (SNR), and/or to capture angle data which are part of the frequency measurement of the received RF signals.

BACKGROUND OF THE INVENTION

Microwave receivers employ various techniques to establish a predetermined point, referred to as a threshold, that is used to start the operation of detecting and encoding selected parameters of received RF signals which comprise a coherent RF carrier and wide-band noise. Typical parameters include RF frequency, RF amplitude and pulse width, and all of which should be accurately encoded in order to preserve the integrity of the system performance. Further, the threshold level for detecting these parameters should also be accurately established. Erroneous determination of the threshold level may either render the receiver insensitive to all signals, or cause the receiver to erroneously trigger in the absence of an RF signal. Either event is not desirable.

Techniques commonly employed to determine the threshold level have generally depended on the establishment of the receiver threshold level based on a time average of noise measurements in the receiver, or based upon an external processor empirically setting the threshold by using a history of receiver false alarm events. In a particular case, known as a digital noise-riding threshold, the microwave receiver continuously samples the noise level within the receiver, averages these samples, adds an offset acting as a safety factor and, then, uses the results to determine the receiver's threshold. Typical sampling intervals cover approximately three milliseconds with updating of the threshold data occurring at the end of each sample interval. Samples are collected only in the absence of the RF signal because to do otherwise would have the threshold level riding on the RF level, rather than on the noise. Even in the absence of the RF signal, because of the integration time of the circuit operation, it may take the microwave receiver as long as six milliseconds to respond to a change in the noise level in its determination of the threshold level.

The prior art used to establish the threshold level seems to suffer from the drawbacks of sampling techniques that consume a relatively large amount of time, such as six milliseconds, and that need to be performed in the absence of RF signals.

It is, therefore, a primary object of the present invention to provide for a circuit arrangement that substantially instantaneously establishes an accurate threshold in the presence of received RF signals.

It is another object of the present invention to provide for a circuit arrangement that establishes a threshold level that takes into account the signal to noise ratio (SNR) of the received RF signals.

It is a further object of the present invention to provide for a circuit arrangement that yields accurate angle data that may be used in the determination of the frequency parameter of the received RF signal.

Other objects of the present invention, as well as the advantages thereof over existing and prior art forms, which will be apparent in view of the following detailed description are accomplished by means hereinafter described and claimed.

SUMMARY OF THE INVENTION

The present invention is directed to a circuit arrangement that receives RF signals comprising a coherent carrier and wideband noise. The circuit arrangement includes a microwave correlator that divides RF signals into two power paths, delays one path with respect to the other, and multiplies the delayed RF signals with the undelayed RF signals to develop sine and cosine quantities that are exploited to establish a predetermined threshold level, a predetermined threshold level that takes into account the signal-to-noise ratio (SNR), and/or angle data that may be used in the measurement of the frequency of the received RF signals.

The circuit arrangement comprises an RF amplifier, a bandpass filter, a power divider, a delay line having a predetermined delay $\tau$, first and second multipliers, a quadrature coupler, first and second low pass filters, first and second analog-to-digital converters respectively providing first and second digital representations, and means for utilizing the first and second digital representations. The RF amplifier receives the RF signal and provides a first output signal at a constant level K. The bandpass filter receives the first output signal and transmits a second output signal comprising a preselected band of filtered RF signals. The power divider receives the second output signal and distributes the power thereof, in a predetermined manner, between third and fourth output signals. The delay line receives the third output signal and develops a fifth output signal. The first multiplier receives the fourth and fifth output signals and develops a first product signal thereof which may be expressed as $K_1^* \cos\pi f\tau$, where $K_1$ is proportional to the constant K, the cosine function is related to fourth and fifth output signals, $f$ is the frequency of the RF signal, and $\tau$ is the delay inserted by the delay line. The first product signal has a DC portion or component which is proportional to the cosine of the phase angle between the fourth and fifth output signals. The quadrature coupler receives the fourth output signal and develops a sixth output signal which is 90° out-of-phase with the fourth output signal. The second multiplier receives the fifth and sixth output signals and develops a second product signal thereof which may be expressed as $K_1^* \sin 2\pi f\tau$, where $K_1$ is proportional to the constant K, the sine function is related to the fifth and sixth signals, $f$ is the frequency of the RF signal, and $\tau$ is the delay inserted by the delay line. The second product signal has a DC portion or component which is proportional to a sine of the phase angle between the fifth and sixth output signals. The first low pass filter receives the cosine product signal and develops a seventh output signal containing cosine information. The second low pass filter receives the sine product signal and develops an eighth output signal containing sine information. The first analog-to-digital converter receives the cosine product signal and provides a digital representation thereof expressed by a first term $K_2^*$ cos φ, where $K_2$ is the magnitude of the first term and is proportional to the constant level K, and φ is an angle related to the phase shift between the fourth and fifth output signals. The second analog-to-digital converter receives the sine product signal and provides a digital representation thereof expressed by a second term $K_2^* \sin \phi$, where $K_2$ is the magnitude of the second term and is proportional to the constant K and φ is the angle related to the phase shift between the fifth and sixth output signals. The means for utilizing the first and second digital representations performs one or all of the functions selected from the group comprising:

(1) establishing a threshold level at which the microwave receiver detects and encodes selected parameters of the RF signal;

(2) establishing a threshold level corresponding to a predetermined signal-to-noise ratio (SNR) for detecting and encoding selected parameters of the RF signal; and (3) determining the tangent angle of the received RF signal as a part of a frequency measurement process performed thereon.

DETAILED DESCRIPTION OF THE PREFERRED EMBODIMENTS

Figure 1:
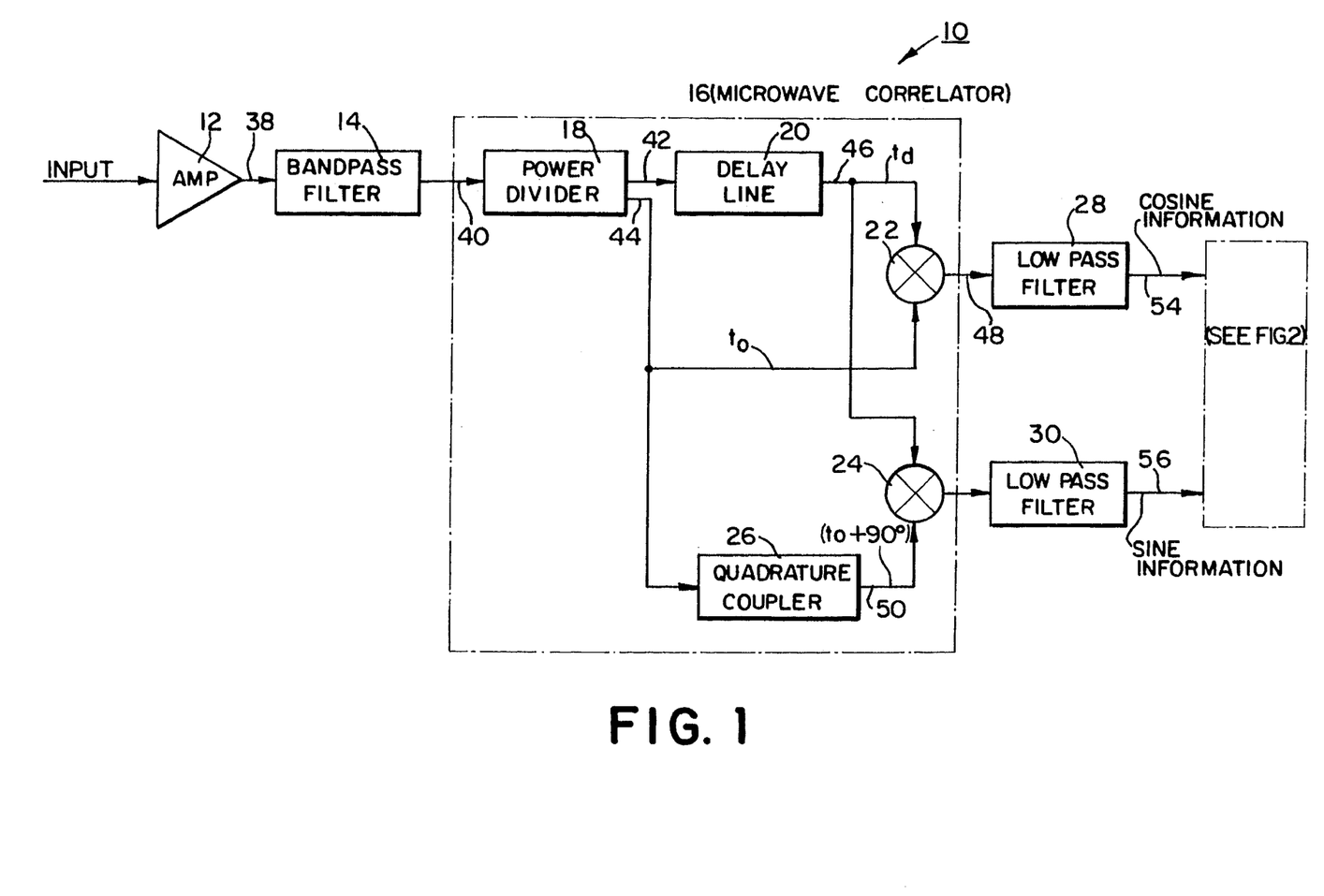
FIGS. 1 and 2 illustrate a circuit arrangement of the present invention.
Figure 2:
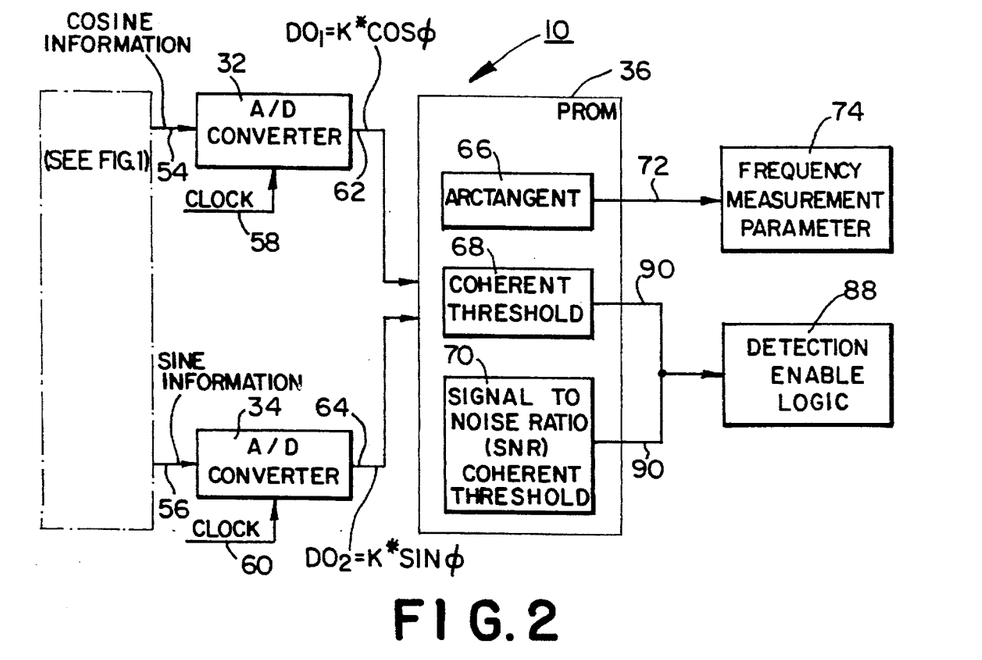

Referring to the drawings, wherein like reference numbers indicate like elements, there is shown in FIGS. 1 and 2 a block diagram of the circuit arrangement 10 of the present invention.

In general, the circuit arrangement 10 receives an RF signal comprising a coherent RF carrier and wide-band noise. The circuit arrangement 10 primarily comprises a microwave correlator which, in general, compares divided signals against each other at various points and delivers an output signal proportional to the correspondence between the signals. The microwave correlator divides the RF signal into two power paths with one path being delayed with respect to the other, and then multiplies the delayed and undelayed RF signals to develop output signals containing sine and cosine information. The sine and cosine information are utilized by the circuit arrangement 10 to accomplish three features of the present invention which are the establishment of a predetermined threshold level for the detection of selected parameters of the RF signal, the establishment of a threshold level that is dependent on the signal-to-noise ratio (SNR), and the determination of the phase angle between the received RF signals which, in turn, is used as part of a frequency measurement process of the received signal. The circuit arrangement 10 detects and encodes RF signals that are included in a typical band of between two (2) GHz to four (4) GHz. The circuit arrangement 10 comprises a plurality of elements, each having a specified reference number and performing a specified functional operation, and each being available as a typical component, or from a typical supplier all of which are given in the below Table 1.

TABLE 1

| REFERENCE NO. | ELEMENT | TYPICAL COMPONENT/ SUPPLIER |
| --- | --- | --- |
| 12 | RF Amplifier | Conventional |
| 14 | Bandpass Filter | Conventional |
| 18 | Power Divider | Conventional |
| 20 | Delay Line | Conventional |
| 22 | Multiplier | Conventional |
| 24 | Multiplier | Conventional |
| 26 | Quadrature Coupler | Conventional |
| 28 | Low Pass Filter | Conventional |
| 30 | Low Pass Filter | Conventional |
| 32 | Analog-to-Digital Converter | Analog Devices AD-9058 |
| 34 | Analog-to-Digital Converter | Analog Devices AD-9058 |
| 36 | PROM | Cypress CY7C263 |

The RF amplifier 12 receives the RF signal and has a limiting feature so that a maximum peak amplitude of the RF signal is provided at a designated level, herein termed a constant K, of its output. As will be apparent hereinafter, this constant K appears in various terms herein, but in a form identified as $K_1$, $K_2$, or $K_3$ so as to distinguish the terms from each other. The RF amplifier provides a limited output over a two (2) GHz to four (4) GHz bandwidth and has a nominal RF gain of 100dB. In one embodiment, the RF amplifier 12 provides a constant power output at an output level of +15dBm. In such an embodiment, any RF input signal to the RF amplifier 12 greater than −85dBm produces the limiting operation of the amplifier. However, it is preferred to maximize the limiting effects of the RF amplifier 12 so that the operation of the RF amplifier is selected to provide at least 10 dB of limiting operation and, therefore, a minimum RF input signal of −75dBm is preferred. The RF amplifier 12 provides a first output signal which is routed to the bandpass filter 14 by way of signal path 38.

The bandpass filter 14, in response to the reception of the first output signal, transmits a second output signal comprising a preselected band of filtered RF signals. Bandpass filter 14 is tuned to have a substantially zero loss and to have a substantially rectangular passband covering the two (2) GHz to four (4) GHz bandwidth. It is preferred that the bandpass filter 14, for one embodiment related to establishing a threshold level that is dependent upon a selected signal to noise ratio (SNR) to be described hereinafter, be selected to be centered at a radiant frequency, $\omega_o$, and have a bandwidth $\omega_B$ (also given in radians). The coherent RF carrier, included in the received RF signal, is located within the bandwidth $\omega_B$ and has a radian frequency, $\omega_c$. Bandpass filter 14 operates so as to establish a band of frequencies that makes up a predetermined RF noise power spectrum. The second output signal of bandpass filter 14 is routed to the microwave correlator 16 by way of signal path 40.

As seen in FIG. 1, the microwave correlator 16 comprises power divider 18, delay line 20, first and second multipliers 22 and 24, and a quadrature coupler 26 all arranged as shown. The power divider 18 receives the second output signal and distributes the power thereof, in a predetermined manner, between the third and fourth output signals carried by signal paths 42 and 44 respectively. It is preferred that the power divider 18 provide about +12dBm power at each of the signal paths 42 and 44. The third output signal on path 42 is delayed with respect to the fourth output signal, shown as $t_o$, on path 44. The third output signal on path 42 is routed to the delay line 20.

The delay line 20 receives the third output signal and provides a fifth output signal that is delayed by a predetermined delay τ having a typical value of 25 ns. The delay of 25 ns is a typical delay value desired for the frequency measuring process of the received RF signal to be further mentioned hereinafter. The delay line 20 provides the fifth output signal, shown as $t_d$, on signal path 46 that is routed to both a first multiplier 22 and a second multiplier 24. Multiplier 22 also receives the fourth output signal $t_o$, and multiplies the fourth ($t_o$) (undelayed) with the fifth ($t_d$) (delayed) to produce a video signal on signal path 48 having a relationship that may be given by the below expression (1):

$$K_1 * \cos 2\pi f \tau$$

where K1 is proportional to constant K of the RF amplifier 12, the cosine function is related to the fourth and fifth output signals, $f$ is the frequency of the received RF signal, in Hz, and τ is the delay developed by delay line 20 and given in ns. Further, the signal present on signal path 48 has a DC component or portion that is proportional to the cosine of the phase angle, representative of the phase shift, between the fourth ($t_o$) and fifth ($t_d$) output signals. The fourth output signal ($t_o$) present on signal path 44 is also routed to the quadrature coupler 26.

Quadrature coupler 26 receives the fourth output signal ($t_o$), and develops a sixth output signal on signal path 50, shown as ($t_o$+90°), which is phase shifted 90° with respect to the fourth output signal. Signal path 50 is routed to the second multiplier 24.

The second multiplier 24 receives the sixth output signal ($T_o$+90°), as well as the fifth output signal ($t_d$) from delay line 20 and multiplies these signals to develop a second product signal path 52 which has a video output having a relationship that may be given by the below expression (2):

$$K1 * \sin 2\pi f \tau$$

where K1 is proportional to the constant K RF amplifier 12, $f$ is the RF frequency of the received RF signal, in Hz, the sine function is related to the fifth and sixth output signals, and τ is the delay developed by the delay line 20 and given in ns. Furthermore, the signal present at signal line 52 has a DC component or portion which is proportional to the sine of the phase angle, representative of the phase shift, between the fifth ($t_d$) and sixth ($t_o$+90°) output signals.

Signal path 52, carrying the sine information, is routed to the second low pass filter 30, and signal path 48 carrying the cosine information, is routed to the first low pass filter 28. The first low pass filter 28 develops a seventh output signal, containing cosine information, on signal path 54. Similarly, the second low pass filter 30 develops an eighth output signal containing sine information, on signal path 56. The signal paths 54 and 56 are respectively applied to analog-to-digital (A/D) converter 32 and analog-to-digital converter 34, which may be further described with reference to FIG. 2.

As shown in FIG. 2, the A/D converters 32 and 34 each receives a clock signal respectively applied tq signal paths 58 and 60; however, the A/D converters 32 and 34 respond equally well to a trigger pulse generated by a one-shot multivibrator. The A/D converters 32 and 34 each provide a six bit digital representation covering a zero bit to 63 bit range; the center of such range being 31.5 bits. The A/D converters 32 and 34 provide a digital representation respectively given by expressions (3) and (4) below:

$$DO_1 = K2 * \cos \phi$$

$$DO_2 = K2 * \sin \phi$$

where K2 is the magnitude of the expressions (3) and (4) and is proportional to the constant K of the RF amplifier 12 and ω is an angle, given in degrees, corresponding to the angle between the delayed and non-delayed signals of the microwave correlator 16. More particularly, the cos φ corresponds to the angle between the delayed signal ($t_d$) and undelayed signal ($t_o$) and the sin ω corresponds to the angle between the delay signal ($t_d$) and the undelayed signal but shifted signal ($t_o$+ 90°). It is preferred that the A/D converters 32 and 34 be clocked at a 40 MHz rate, so that the threshold level, to be described, provided by the present invention is generated once every 25 ns. The signals $DO_1$ and $DO_2$ are applied to the PROM 36.

The PROM 36 may be a 4096 by 8 bit device having a 12 bit address capability. The PROM 36 serves as a means for utilizing the digital representations $DO_1$ and $DO_2$ to perform one or all of the functions selected from a group comprising the following:

(1) establishing a threshold level employed to detect and encode selected parameters of the RF signals;

(2) establishing a threshold level, corresponding to a predetermined signal-to-noise ratio (SNR) employed to detect and encode selected parameters of the RF signals; and (3) determining the phase angle between the received RF signals as part of the frequency measurement process performed on the received RF signals.

The three functions performed by the PROM 36 are schematically illustrated by three boxes which are as follows: arc tangent 66, coherent threshold 68, and signal-to-noise ratio (SNR) coherent threshold 70. The angle φ of expressions (3) and (4) is quantized in the PROM 36 to divide its 360° range into, typically, 64 increments.

The arc tangent processing sequence 66 is part of the process for measuring the frequency of the received RF signal. The arc tangent routine is based upon relationship given by the following expression (5):

$$\phi = \tan^{-1}(K3 * \sin \phi)/(K3 * \cos \phi)$$

where K3 is a magnitude (nominally one (1) volt) and is proportional to the constant output (K) of the RF amplifier 12, and φ, in degrees, is the angle previously given for expressions (3) and (4). The results of the routine 66 are delivered, by way of signal path 72, to an external circuit 74 that uses such data and completes the frequency measurement of the applied RF signal. The completion of the frequency measurement is not considered part of the present invention and, therefore, is not to be further described herein.

The coherent threshold processing sequence 68 receives the signals $DO_1$ and $DO_2$ of expressions (3) and (4) and combines the signals into a power quantity $P_o$ having the following relationship given in the below expression (6):

$$P_o = \sin^2 \phi + \cos^2 \phi$$

The signal $P_o$ is then compared to a program limit $T_L$ to determine the threshold level of the present invention and such determination may be further described with reference to FIG. 3.

Figure 3:
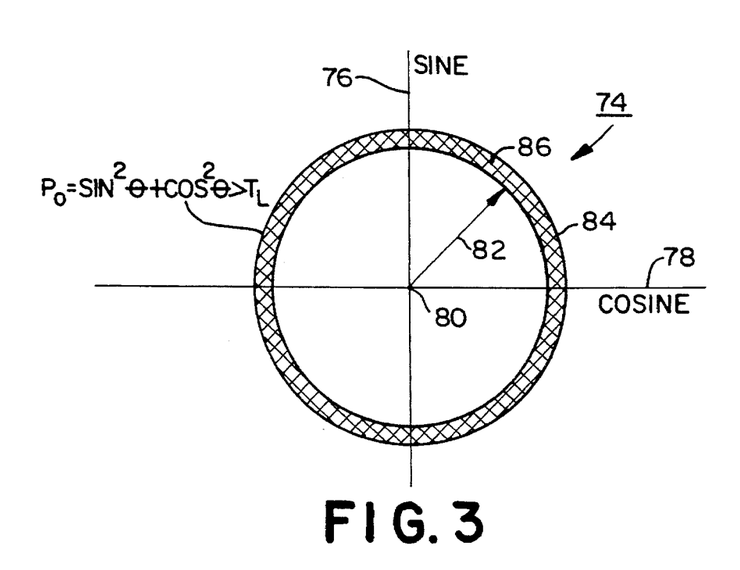
FIG. 3 illustrates the response characteristic of the present invention in establishing a threshold level.

FIG. 3 illustrates a donut shaped torus 74 having a Y axis 76, indicated by the SINE function of expression (6), and an X axis 78 indicated by the COSINE function of expression (6). The torus 74 has a center 80 for four quadrants and from which extends a radius 82. The radius 82 is shown as defining the lower limit of expression (6), whereas the upper limit is shown as defined by reference number 84. The radius 82 corresponds to the summation digital quantity derived from the signals $DO_1$ and $DO_2$ (expressions (3) and (4)) inherently possessed in expression (6). As seen in FIG. 3, the lower and upper limits thereof determine a circumference band 86 that defines the program limit $T_L$ related to expression (6). More particularly, when the quantities of expression (6) have values so that when the value $P_o$ of expression (6) exceeds the $T_L$ limit, then a coherent threshold level is generated. The exact range of expression (6); i.e., the circumferential band 86 of FIG. 3, is somewhat dependent on the ratio of the RF signal to the RF bandwidth, but a typical value that generates a coherent threshold level is when the digital value of the radius 82 is greater than 15, but less than 31.5. The results of the processing sequence 68 determines the threshold level which is outputted from PROM 36 (see FIG. 2) as a one bit representation, and which is routed to detection/enable logic 88 of a microwave receiver by way of signal path 90. The detection/enable logic 88 is supplied with an instantaneously determined threshold level derived during the presence of the received RF signals. The detection/enable logic 88 is not considered part of the present invention and, therefore, is not further described herein.

It should now be appreciated, that unlike the prior art devices, the present invention substantially instantaneously establishes a threshold level in the presence of an RF signal. More particularly, the present invention establishes a threshold level that is determined by the sine and cosine functions from the delayed and undelayed paths of the coherent RF signal which is part of the RF signal that also includes wide-band noise. The wide-band noise comprising the RF signal is filtered by low pass filters 28 and 30. Further, this wide-band noise is filtered and has its power spectrum defined by the bandpass filter 14. The overall effect of the circuit arrangement of FIGS. 1 and 2 is to provide an accurate threshold level even in the presence of wide-band noise.

The third feature of the present invention, of establishing a threshold level determined by the signal-to-noise ratio (SNR) of the RF signal, is accomplished by the processing segment 70 of PROM 36 generally indicated in FIG. 2. The processing segment 70 accepts as its input parameter the total power $P_o$, given by expression (6). The total power $P_o$ is derived from the RF limiting amplifier 12 which is selected to provide constant K having a typical value of 1.0 volts. The RF signal-to-noise ratio (SNR) at the RF limiting amplifier output is at a power ratio, herein termed Q. The output power $P_o$ of expression (6) is composed of two terms, Pdc and Pac. The first term Pdc defines a constant or average DC component, and the second term Pac defines a variable or AC component. Mathematically, the term (average DC voltage) Pdc is the square of the mean (or average) voltage, whereas the term (AC voltage) Pac is the square of the standard deviation (the variance) of the output voltage of expression (6). The terms Pdc and Pac; may be mathematically expressed as $\eta^2$ and $\sigma^2$, respectively, which in turn have the following relationships respectively given by the below expressions (7) and (8):

$$\eta^2 = 2(Q/1+Q)^2 + Q/(1+Q)^2 (4 \cos \omega_o\tau)(\sin(.5\omega_\beta\tau)/\omega_\beta\tau) + 1/(1+Q)^2(4 \cos^2(\omega_o\tau))(\sin^2)(.5\omega_\beta\tau)/\omega^2_\beta\tau^2) \quad (7)$$

$$\sigma^2 = (Q/(1+Q)^2)(2\omega_o/\omega_\beta + 2 \sin \omega_o\tau/\omega_\beta\tau) + 1/(1+Q)^2[\ \omega_o/\omega_\beta - (\omega_o/\omega_\beta)^2 + (1-\omega_o/\omega_\beta)(\sin(\omega_o\tau)/\omega_\beta\tau) + 2 \sin^2(.5\omega_o\tau)/\omega^2_\beta\tau^2] \quad (8)$$

The term $\tau$ in expressions (7) and (8) is the delay quantity inserted by delay line 20 of FIG. 1. If this term $\tau$ was set to zero, then expressions (7) and (8) would be representative of a response of a square-law detector whose output is proportional to the square of the rms value of a constant power input.

Figure 4:
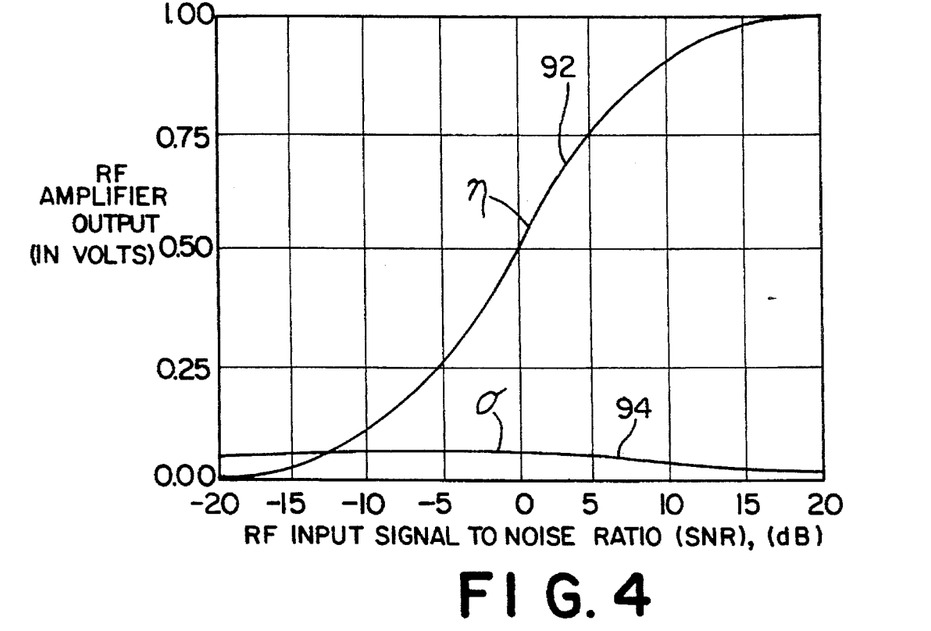
FIG. 4 illustrates the response characteristic in establishing a threshold level associated with the signal-to-noise ratio (SNR).

The benefits of the present invention may be appreciated by comparing the response of the circuit arrangement 10 against that of a square-law detector and such comparison may be accomplished by modeling techniques. A common type wide-band microwave receiver was modeled having a RF bandwidth covering a band of two (2) GHz to four (4) GHz, a ten (10) MHz video bandwidth and employing a 25 ns delay line 20. The response of such a modeled microwave receiver was plotted using a normalized output that varied as a function of the RF input signal-to-noise ratio (SNR), given in dB, and is shown in FIG. 4. The response curve of FIG. 4 is representative of the response of circuit arrangement 10. Similarly, a microwave receiver similar to that of FIG. 4, with the exception that it was devoid (square-law detector) of a delay line, was modeled and the normalized output varied as a function of the RF input signal-to-noise ratio (SNR). The response of the square-law detector is shown in FIG. 5.

FIG. 4 shows the response of the circuit arrangement 10 to an RF signal (coherent RF carrier) having a center frequency of three (3) GHz. FIG. 4 has a Y axis showing the normalized output (in volts) of the RF amplifier 12, and an X axis shown by the RF input signal-to-noise ratio (SNR) quantity, in dB. The voltage scale (Y axis) is normalized to one (1) volt. FIG. 4 further illustrates two plots, 92($\eta$) and 94($\sigma$), in which plot 92 is an upper curve that shows the average DC voltage (Pdc) as a function of RF input SNR, whereas plot 94 is the lower curve and shows the standard deviation of the AC component (Pac). From FIG. 4 it should be noted that the central portion of plot 92 has a substantial linear variation of the average DC voltage (Pdc) as a function of RF input SNR. This substantial variation may be further appreciated when compared against the plots shown in FIG. 5.

Figure 5:
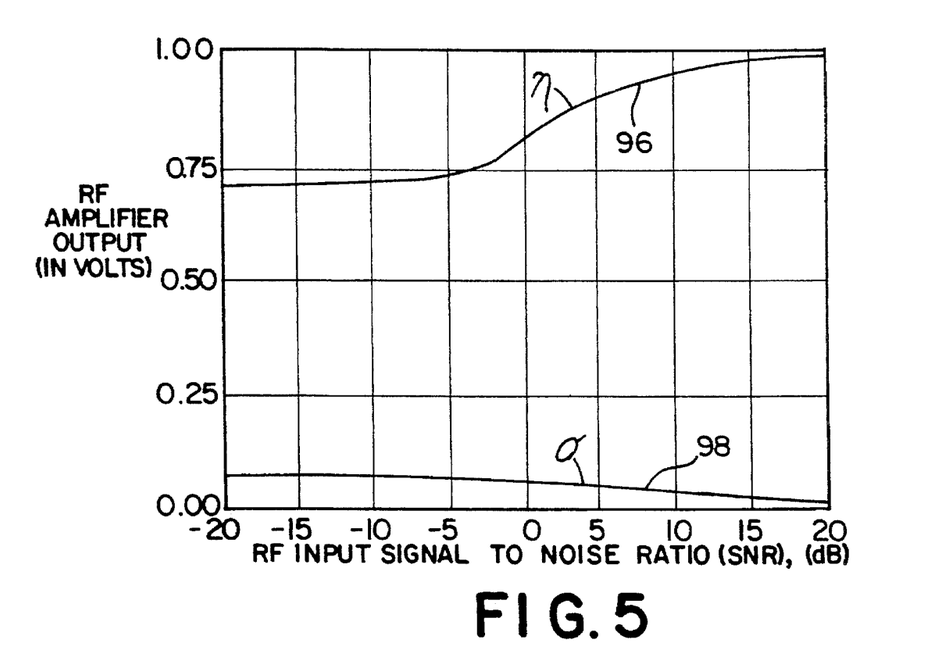
FIG. 5 illustrates the response characteristic of a square-law detector not having the benefits of the present invention.

FIG. 5 has X and Y axes which are the same as the X and Y axes of FIG. 4. FIG. 5 further illustrates plots 96 and 98, which are respectively related to plots 92 and 94 of FIG. 4, and which also respectively show the quantities $\eta$ and $\sigma$. The plot 98 is substantially the same as the plot 94 of FIG. 4. However, a comparison between plot 96 of FIG. 5 and plot 92 of FIG. 4, reveals that the plot 92 has substantially larger variation as compared to that of plot 96.

A further review of plot 92 of FIG. 4 reveals that its central portion has a relatively wide spread of SNR values that are definable, in terms of the voltage of the Y axis, by the linear portion (−10dB to +10dB SNR) of FIG. 4. Such a linear response is beneficial in defining a threshold level in terms of SNR. For example, if it is desired to provide a threshold level that is dependent upon signal-to-noise ratio, then such a threshold level for a signal-to-noise ratio of −5 db may be established by selecting an RF amplifier output of 0.25 volts. This 0.25 volts provides a digital representation serving as an input parameter to the PROM 36 that may be used by the program segment 70 to establish a threshold function that corresponds to a predetermined RF signal-to-noise ratio (SNR). The program segment 70 upon the detection of the threshold (0.25V) corresponding to the RF SNR (−5dB), may generate a one bit quantity that is applied to the signal path 90 (see FIG. 2) which, in turn, is routed to the detection and enable logic 88 previously discussed. The above discussion is also applicable to plot 94 of FIG. 4, but the usage of plot 94 is not so easily implemented as that of plot 92.

It should now be appreciated that the practice of the present invention provides a threshold level that is dependent upon a predetermined RF input SNR. Unlike prior art devices, this predetermined threshold level eliminates the necessity for sampling the receiver during noise level below this value. Further, the present invention provides an instantaneous indication of the RF input SNR so as to instantaneously establish the desired threshold for sampling the preselected parameters of the RF signal input. The threshold dependent upon the RF input SNR is useful to overcome any noise, jamming, or interference designed to effect receiver operation. Such a non-interference operation is realized because the threshold detector is not triggered by any broadband noise thereby allowing the receiver to operate at a controlled RF input SNR, even in the presence of jamming and, thereby, preventing false triggering due to changes of noise level created by thermal noise or jammer noise.

In addition to providing a circuit arrangement that achieves various types of threshold levels to establish the enablement for detecting selected parameters of the received RF signals, the present invention also teaches the principles of establishing threshold levels for various other digital devices so as to provide an accurate measurement for the detection of other signal parameters.

What I claim is:

1. A circuit arrangement for receiving RF signals comprising a coherent RF carrier and wide-band noise, said circuit arrangement comprising:

(a) an RF amplifier receiving RF signals and providing a first output signal at a constant level K;

(b) a bandpass filter receiving said first output signal and transmitting a second output signal comprising a preselected band of filtered RF signals;

(c) a power divider receiving said second output signal and distributing the power thereof in a predetermined manner between third and fourth output signals;

(d) a delayed line having a delay characteristic T and receiving said third output signal and developing a fifth output signal;

(e) a first multiplier receiving said fourth and fifth output signals and developing a first product signal thereof and which is expressed as: $K_1 * \cos 2\pi f \tau$, where $K_1$ is proportional to the constant level K, the cosine function is related to the angle between the fourth and fifth output signals, $f$ is the frequency of the RF signals and $\tau$ is the delay inserted by said delay line, said first product signal having a DC portion which is proportional to the cosine of the phase angle between said fourth and fifth output signals;

(f) a quadrature coupler receiving said fourth output signal and developing a sixth output signal which is 90° phase shifted with respect to said fourth output signal;

(g) a second multiplier receiving said fifth output signal and said sixth output signal and developing a second product signal thereof and which is expressed as: $K_1 * \sin 2\pi f \tau$, where $K_1$ is proportional to the constant level K, the sine function is related to the angle between the fifth and sixth output signals, $f$ is the frequency of the RF signals, and $\tau$ is the delay inserted by said delay line, said second product signal having a DC portion which is proportional to the sine of the phase angle between said fifth and said sixth output signals;

(h) a first low pass filter receiving said cosine product signal and developing a seventh output signal containing cosine information;

(i) a second low pass filter receiving said sine product signal and developing an eighth output signal containing sine information;

(j) a first analog-to-digital converter receiving said seventh output signal and providing a digital representation thereof expressed by a first term $K_2 * \cos\phi$, where $K_2$ is proportional to the constant level K and $\phi$ is the angle of the phase shift between said fourth and fifth output signals;

(k) a second analog-to-digital converter receiving said eighth output signal and providing a digital representation thereof expressed by a second term $K_2 * \sin\phi$, where $K_2$ is proportional to the constant level K, and $\phi$ is the angle of the phase shift between said fifth and sixth output signals; and (l) means for utilizing said first and second digital representations to perform a function selected from the group comprising; (1) establishing a threshold level for detecting and encoding selected parameters of said RF signals; (2) establishing said threshold level corresponding to a predetermined signal-to-noise ratio (SNR) for detecting and encoding selected parameters of said RF signals; and (3) determining the tangent angle of the received RF signals.

2. A circuit arrangement for establishing a threshold level at which a microwave receiver detects and encodes selected parameters of received RF signals comprising a coherent RF carrier and wide-band noise, said circuit arrangement comprising:

(a) an RF amplifier receiving RF signals and providing a first output signal at a constant level K;

(b) a bandpass filter receiving said first output signals and transmitting second output signals comprising a preselected band of filtered RF signals;

(c) a power divider for receiving said second output signals and distributing the power thereof in a predetermined manner between third and fourth output signals;

(d) a delay line having a predetermined delay characteristic $\tau$ and receiving said third output signals and developing a fifth output;

(e) a first multiplier receiving said fourth and fifth output signals and developing a first product signal thereof and which is expressed as: $K_1 * \cos 2\pi f \tau$, where $K_1$ is proportional to the constant level K, the cosine function is related to the angle between the fourth and fifth output signals, $f$ is the frequency of the RF signals and $\tau$ is the delay inserted by said delay line, said first product signal having a DC portion which is proportional to the cosine of the phase angle between said fourth and fifth output signals;

(f) a quadrature coupler receiving said fourth output signal and developing a sixth output signal which is 90° phase shifted with respect to said fourth output signal;

(g) a second multiplier receiving said fifth and sixth output signals and developing a second product signal thereof and which is expressed as: $K_* \sin 2\pi f \tau$, where $K_1$ is proportional to the constant level K, the sine function is related to the angle between the fifth and sixth output signals, $f$ is the frequency of the RF signals and $\tau$ is the delay inserted by said delay line, said second product signal having a DC portion which is proportional to the sine of the phase angle between said fifth and sixth output signals;

(h) a first low pass filter receiving said cosine product signal and developing a seventh output signal containing cosine information;

(i) a second low pass filter receiving said sine product signal and developing an eighth output signal containing sine information;

(j) a first analog-to-digital converter receiving said seventh output signal and providing a digital representation thereof expressed by a first term as: $K_2^* \cos\phi$, where $K_2$ is proportional to the constant K and $\phi$ is the angle between said fourth and fifth output signals;

(k) a second analog-to-digital converter receiving said eighth output signal and providing a digital representation thereof expressed by a second term $K_2^* \sin\phi$, where $K_2$ is proportional to the constant K and $\phi$ is the angle of the phase shift between said fifth and sixth output signals;

(l) means for multiplying said cosine quantity of said first term by itself to provide a quantity $\cos^2\phi$ and also multiplying said sine quantity of said second term by itself to provide a quantity $\sin^2\phi$, and the, adding said multiplied quantities to provide a power term $P_o = \sin^2\phi + \cos^2\phi$;

(m) means for comparing said power term $P_o = \sin^2\phi + \cos^2\phi$ against a predetermined value and generating a ninth output signal when said power term exceeds said predetermined value, said ninth output signal enabling said detecting and encoding of said selected parameters.

3. A circuit arrangement according to claim 1, wherein said first and second analog-to-digital converters provide a six bit digital representation covering a 0 bit to 63 bit range and said angle $\phi$ varies from 0° to 360°.

4. A circuit arrangement according to claim 3, wherein said means for multiplying further comprises means for quantizing said angle $\phi$ into 64 increments.

5. A circuit arrangement according to claim 3, wherein said predetermined value of said means for comparing has minimum and maximum values respectively represented by digital quantities of 15 and 31.5.

6. A circuit arrangement according to claim 2, wherein said RF amplifier has a limited maximum peak amplitude gain of about 100db, said received RF signals have a level of greater than −85dBM and said RF amplifier provides a peak power constant output level of +15dBm.

7. A circuit arrangement according to claim 2, wherein said RF amplifier has a limited maximum peak amplitude gain of about 100dB, said received signals have a level of greater than −75dBM and the RF amplifier provides a peak power constant output of +15dBm.

8. A circuit arrangement according to claim 2, wherein said bandpass filter passes frequencies included in a range of about 2 GHz to about 4 GHz.

9. A circuit arrangement according to claim 2, wherein said power divider provides about +12dBm power at each of said third and fourth outputs.

10. A circuit arrangement according to claim 1, wherein said delay line provides a delay $\tau$ of about 25 nanoseconds between said third and fifth outputs.

11. A circuit arrangement according to claim 2, wherein said first and second analog-to-digital converters are responsive to a clock signal having a repetition rate of about 40 MHz.

12. A circuit arrangement for establishing a threshold having a predetermined signal-to-noise (SNR) with a power ratio Q, said threshold determining when a microwave receiver detects and encodes selected parameters of RF signals comprising wide-band noise and a coherent RF carrier having a radian frequency $\omega_c$, said circuit arrangement comprising:

(a) a RF amplifier receiving said RF signals and providing a first output signal at a constant level K;

(b) a bandpass filter with a response centered at a radian frequency $\omega_o$ and having a bandwidth $\omega_B$ that includes said radian frequency $\omega_c$ of said coherent RF carrier;

(c) a power divider receiving said second output signals and distributing the power thereof in a predetermined manner between third and fourth output signals;

(d) a delay line having a $\tau$ characteristic and receiving said third output signals and developing a fifth output signal;

(e) a first multiplier receiving said fourth and fifth output signals and developing a first product signal thereof and which is expressed as: $K_1^* \cos 2\pi f \tau$, where $K_1$ is proportional to the constant level K, the cosine function is related to the angle between the fourth and fifth output signals, $f$ is the frequency of the RF signals, and $\tau$ is the delay inserted by said delay line, said first product signal having a DC portion which is proportional to the cosine of the phase angle between said fourth and fifth output signals;

(f) a quadrature coupler receiving said fourth output signal and developing a sixth output signal which is 90° phase shifted with respect to said fourth output signal;

(g) a second multiplier receiving said fifth and sixth output signals and developing a second product signal thereof and which is expressed as: $K_1^* \sin 2\pi f \tau$, where $K_1$ is proportional to the constant level K, the sine function is related to the angle between the fifth and sixth output signals, $f$ is the frequency of the RF signals and $\tau$ is the delay inserted by said delay line, said second product signal having a DC portion which is proportional to the sine of the phase angle between said fifth and sixth output signals;

(h) a low pass filter having a critical frequency $\omega_v$ and developing a seventh output signal containing cosine information;

(i) a second low pass filter having a critical frequency of $\omega_v$ and developing an eighth output signal containing sine information;

(j) a first analog-to-digital converter receiving said seventh output signal and providing a digital representation thereof expressed by a first term: $K_2^* \cos\phi$, where $K_2$ is proportional to the constant K and $\phi$ is an angle of the phase shift between said fourth and fifth output signals;

(k) a second analog-to-digital converter receiving said eighth output signal and providing a digital representation thereof expressed by a second term: $K_2^* \sin\phi$, where $K_2$ is proportional to the constant K and $\phi$ is the angle of phase shift between said fifth and sixth output signals;

(l) a PROM receiving said quantities $K_2^* \sin\phi$ and $K_2^* \cos\phi$ and generating an output signal $P_o$ defined as $\sin^2\phi + \cos^2\phi$ and wherein said $P_o$ contains a first term defining a constant DC voltage Pdc and a second term defining an AC voltage Pac, said first and second terms being respectively expressed as third term $\eta^2$ which is representative of a mean voltage of $P_o$ and a fourth term $\sigma^2$ which is representative of a standard deviation of the $P_o$ signal, said third and fourth terms $\eta^2$ and $\sigma^2$ respectively having a relationship given by the respective equations below:

$$\eta^2 = 2(Q/1+Q)^2 + Q/(1+Q)^2 (4\cos\omega_o\tau)(\sin(.5\omega_B\tau)/\omega_B\tau) + 1/(1+Q)^2 \quad (4$$

$$\cos^2(\omega_o\tau))(\sin^2(.5\omega_\beta\tau)/\omega^2_\beta\tau^2) \qquad (7)$$

$$\sigma^2=(Q/(1+Q)^2)(2\omega_o/\omega_\beta+2\ \sin\omega_o\tau/\omega_\beta\tau) +1/(1+Q)^2[\omega_o/\omega_\beta-(\omega_o/\omega_\beta)^2+ (1-\omega_o/\omega_\beta)(\sin(\omega_o\tau)/\omega_\beta\tau)+2\ \sin^2\ (.5\omega_o\tau)/\omega^2_\beta\tau^2] \qquad (8)$$

(m) means for comparing said third and fourth terms against predetermined values that are indicative of said predetermined SNR and generating a ninth output signal when either of said third and fourth terms exceeds its respective predetermined value, said ninth output signal enabling said detection and encoding of said selected parameters.

13. A circuit arrangement according to claim 12, wherein said first and second analog-to-digital converters provide a six bit digital representation covering a 0 bit to 63 bit range and said angle $\phi$ varies from 0° to 360°.

14. A circuit arrangement according to claim 12, wherein said delay $\tau$ has a value of about 25 ns.

15. A circuit arrangement for determining the tangent angle of a RF signal comprising a coherent RF carrier and wide-band noise, said circuit arrangement comprising:

(a) a RF amplifier receiving RF signals and providing a first output signal at a constant level K;

(b) a bandpass filter receiving said first output signal and transmitting a second output signal comprising a preselected band of filtered RF signals;

(c) a power divider receiving said second output signal and distributing the power thereof in a predetermined manner between third and fourth output signals;

(d) a delay line having a delay characteristic T and receiving said third output signal and developing a fifth output signal;

(e) a first multiplier receiving said fourth and fifth output signals and developing a first product signal thereof and which is expressed as: $K_1 \cos 2\pi f\tau$, where $K_1$ is proportional to K, the cosine function is related to said fourth and fifth output signals, $f$ is the frequency of the RF signal and T is the delay characteristic of said delay line, said first product signal having a DC portion which is proportional to the cosine of the phase angle between said fourth and fifth output signals;

(f) a quadrature coupler receiving said fourth output signal and developing a sixth output signal which is 90° phase shifted with respect to said fourth output signal;

(g) a second multiplier receiving said fifth and sixth output signals and developing a second product signal thereof and is expressed as: $K_1 \sin 2\pi f\tau$, where $K_1$ is proportional to the constant K, the sine function is related to the fifth and sixth output signals, $f$ is the frequency of the RF signals and $\tau$ is the delay characteristic of the delay line, said second product signal having a DC portion which is proportional to the sine of the phase angle between said fifth and sixth output signals;

(h) a first low pass filter receiving said cosine product signal and developing a seventh output signal containing cosine information;

(i) a second low pass filter receiving said sine product signal and developing an eighth output signal containing sine information;

(j) a first analog-to-digital converter receiving said seventh output signal and providing a digital representation thereof expressed by a first term: $K_2^* \cos \phi$, where $K_2$ is proportional to the constant K and $\phi$ is the phase angle between the fourth and fifth output signals;

(k) a second analog-to-digital converter receiving said eighth output signal and providing a digital representation thereof expressed by a second term: $K_2^* \sin \phi$, where $K_2$ is proportional to the constant K and $\phi$ is the phase angle between the fifth and sixth output signals;

(l) means for receiving said first digital representation of $K_2 \cos \phi$ and said second digital representation of $K_2 \sin \phi$ and then dividing said first digital representation by said second digital representation to generate a third term $\tan \phi$; and (m) means for receiving said third term $\tan \phi$; and utilizing said third term to define the frequency of said received RF signal.

16. A method for establishing a threshold level at which a microwave receiver detects and encodes selected parameters of received RF signals comprising a coherent RF carrier and wide-band noise, said method comprising the steps of:

(a) providing an RF amplifier for receiving RF signals and providing a first output signal at a constant level K;

(b) providing a bandpass filter for receiving said first output signals and transmitting second output signals comprising a preselected band of filtered RF signals;

(c) providing a power divider for receiving said second output signals and distributing the power thereof in a predetermined manner between third and fourth output signals;

(d) providing a delay line having a selectable delay characteristic $\tau$ for receiving said third output signal and developing a fifth output;

(e) selecting a predetermined value for said delay characteristic $\tau$;

(f) providing a first multiplier for receiving said fourth and fifth output signals and developing a first product signal thereof and which is expressed as: $K_1^* \cos 2\pi f\tau$, where $K_1$ is proportional to the constant level K, the cosine function is related to the angle between the fourth and fifth output signals, $f$ is the frequency of the RF signals and $\tau$ is the delay inserted by said delay line, said first product signal having a DC portion which is proportional to the cosine of the phase angle between said fourth and fifth output signals;

(g) providing a quadrature coupler for receiving said fourth output signal and developing a sixth output signal which is 90° phase shifted with respect to said fourth output signal;

(h) providing a second multiplier for receiving said fifth and sixth output signals and developing a second product signal thereof and which is expressed as: $K_1^* \sin 2\pi f\tau$, where $K_1$ is proportional to the constant level K, the sine function is related to the angle between the fifth and sixth output signals, $f$ is the frequency of the RF signals, and $\tau$ is the delay inserted by said delay line, said second product signal having a DC portion which is proportional to the sine of the phase angle between said fifth and sixth output signals;

(i) providing a first low pass filter for receiving said cosine product signal and developing a seventh output signal containing cosine information;

(j) providing a second low pass filter for receiving said sine product signal and developing an eighth output signal containing sine information;

(k) providing a first analog-to-digital converter for receiving said seventh output signal and providing a digital representation thereof expressed by a first term: $K_2^* \cos \phi$, where $K_2$ is proportional to the constant K and $\phi$ is the angle between said fourth and fifth output signals;

(l) providing a second analog-to-digital converter for receiving said eighth output signal and providing a digital representation thereof expressed by a second term: $K_2 \sin \phi$, where $K_2$ is proportional to the constant K and $\phi$ is the angle of the phase shift between said fifth and sixth output signals;

(m) providing means for multiplying said cosine quantity of said first term by itself to provide a quantity $\cos^2 \phi$ and also multiplying said sine quantity of said second term by itself to provide a quantity $\sin^2 \phi$, and, then, adding said quantities to provide a power term $P_o = \sin^2 + \cos^2 \phi$; and (n) providing means for comparing said power term $P_o = \sin^2 \phi + \cos^2 \phi$ against a predetermined value and generating a ninth output signal when said power term exceedS-said predetermined value, said ninth output signal enabling said detection and encoding of said selected parameters.

17. A method for establishing a threshold level having a predetermined signal-to-noise (SNR) with a power ratio Q, said threshold level determining when a microwave receiver detects and encodes selected parameters of RF signals comprising wide-band noise and a coherent RF carrier having a radian frequency $\omega_c$, said method comprising the steps of:

(a) providing a RF amplifier for receiving said RF signals and providing a first output signal at a constant level K;

(b) providing a bandpass filter with a response centered at a radian frequency $\omega_o$ and having a bandwidth $\omega_B$ that includes said radian frequency $\omega_c$ of said coherent RF carrier;

(c) providing a power divider for receiving said second output signals and distributing the power thereof in a predetermined manner between third and fourth output signals;

(d) providing a delay line having a selectable $\tau$ characteristic and receiving said third output signals and developing a fifth output signal;

(e) selecting said $\tau$ characteristic for a predetermined value;

(f) providing a first multiplier for receiving said fourth and fifth output signals and developing a first product signal thereof and which is expressed as: $K_1 * \cos 2\pi f \tau$, where $K_1$ is proportional to the constant level K, the cosine function is related to the angle between the fourth and fifth output signals, $f$ is the frequency of the RF signals, and $\tau$ is the delay inserted by said delay line, said first product signal having a DC portion which is proportional to the cosine of the phase angle between said fourth and fifth output signals;

(g) providing a quadrature coupler for receiving said fourth output signal and developing a sixth output signal which is 90° phase shifted with respect to said fourth output signal;

(h) providing a second multiplier receiving said fifth and sixth output signals and developing a second product signal thereof and which is expressed as: $K_1 * \sin 2\pi f \pi$, where $K_1$ is proportional to the constant level K, the sine function is related to the angle between the fifth and sixth output signals, $f$ is the frequency of the RF signals, and $\tau$ is the delay inserted by said delay line, said second product signal having a DC portion which is proportional to the sine of the phase angle between said fifth and sixth output signals;

(i) providing a low pass filter having a critical frequency $\omega_v$ and developing a seventh output signal containing cosine information;

(j) providing a second low pass filter having a critical frequency of $\omega_v$ and for developing an eighth output signal containing sine information;

(k) providing a first analog-to-digital converter for receiving said seventh output signal and providing a digital representation thereof expressed by a first term $K_2* \cos \phi$, where $K_2$ is proportional to the constant K and $\phi$ is the angle of the phase shift between said fourth and fifth output signals;

(l) providing a second analog-to-digital converter for receiving said eighth output signal and providing a digital representation thereof expressed by a second term $K_2* \sin \phi$, where $K_2$ is proportional to the constant K and $\phi$ is the phase angle between said fifth and sixth output signals;

(m) providing a PROM for receiving said quantities $K_2* \sin \phi$ and $K_2* \cos \phi$ and generating an output signal $P_o$ defined as $\sin^2 \phi + \cos^2 \phi$ and wherein said $P_o$ contains a first term defining a constant DC voltage Pdc and a second term defining an AC voltage Pac, said first and second terms being respectively expressed as third term $\eta^2$ which is representative of a mean voltage and a fourth term $\sigma^2$ which is representative of a standard deviation of the $P_o$ signal, said third and fourth terms $\eta^2$ and $\sigma^2$ respectively having a relationship given by the respective equations below:

$$\eta^2 = 2(Q/1+Q)^2 + Q/(1+Q)^2 (4\cos \omega_o \tau)(\sin(.5\omega_B\tau)/\omega_B\tau) + 1/(1+Q)^2 (4\cos^2(\omega_o\tau))(\sin^2(.5\omega_B\tau)/\omega^2_B\tau^2) \quad (7)$$

$$\sigma^2 = (Q/(1+Q)^2)(2\omega_o/\omega_B \, 2 \sin \omega_o\tau/\omega_B\tau) + 1/(1+Q)^2 \, [\omega_o/\omega_B - (\omega_o/\omega_B)^2 + (1-\omega_o/\omega_B)(\sin(\omega_o\tau)/\omega_B\tau) + 2\sin^2(.5\omega_o\tau)/\omega^2_B\tau^2] \quad (8)$$

(n) providing means for comparing said third and fourth terms against predetermined values that are indicative of said predetermined SNR and generating a ninth output signal when either of said third and fourth terms exceeds its predetermined value, said ninth output signal enabling said detecting and encoding of said selected parameters.

18. A method for determining the tangent angle of a RF signal comprising a coherent RF carrier and wide-band noise, said method comprising the steps of:

(a) providing a RF amplifier for receiving RF signals and providing a first output signal at a constant level K;

(b) providing a bandpass filter for receiving said first output signal and transmitting a second output signal comprising a preselected band of filtered RF signals;

(c) providing a power divider for receiving said second output signal and distributing the power thereof in a predetermined manner between third and fourth output signals;

(d) providing a delay line having a selectable delay characteristic $\tau$ and receiving said third output signal and developing a fifth output signal;

(e) selecting a predetermined value for said delay characteristic $\tau$;

(f) providing a first multiplier for receiving said fourth and fifth output signals and developing a first product signal thereof and which is expressed as: $K_1* \cos 2\pi f \tau$, where $K_1$ is proportional to the constant level K, the cosine function is related to the angle between the fourth and fifth output signals, $f$ is the frequency of the RF signals, and $\tau$ is the delay inserted by said delay line, said first product signal having a DC portion which is proportional to the cosine of the phase angle between said fourth and fifth output signals;

(g) providing a quadrature coupler for receiving said fourth output signal and developing a sixth output signal which is 90° phase shifted with respect to said fourth output signal;

(h) providing a second multiplier for receiving said fifth and sixth output signals and developing a second product signal thereof and which is expressed as: $K_1 * \sin 2\pi f\tau$, where $K_1$ is proportional to the constant level K, the sine function is related to the angle between the fifth and sixth output signals, $f$ is the frequency of the RF signals, and $\tau$ is the delay inserted by said delay line, said second product signal having a DC portion which is proportional to the sine of the phase angle between said fifth and sixth output signals;

(i) providing a first low pass filter for receiving said cosine product signal and developing a seventh output signal containing cosine information;

(j) providing a second low pass filter for receiving said sine product signal and developing an eighth output signal containing sine information;

(k) providing a first analog-to-digital converter for receiving said seventh output signal and providing a digital representation thereof expressed by a first term $K_2 * \cos \phi$, where $K_2$ is proportional to the constant K and $\phi$ is the phase angle between the fourth and fifth output signal;

(l) providing a second analog-to-digital converter for receiving said eighth output signal and providing a digital representation thereof expressed by a second term $K_2 * \sin \phi$, where $K_2$ is proportional to the constant K and $\phi$ is the phase angle between the fifth and sixth output signals;

(m) providing means for receiving said first digital representation of $K_2 * \sin \phi$ and said second digital representation of $K_2 * \cos \phi$ and then dividing said first digital representation by said second digital representation to generate a third term $\tan \phi$; and (n) providing means for receiving said third term $\tan \phi$ and utilizing said third term in determining the frequency of said received RF signal.

* * * * *

UNITED STATES PATENT AND TRADEMARK OFFICE
CERTIFICATE OF CORRECTION

PATENT NO. : 5,455,845

DATED : October 3, 1995

INVENTOR(S) : William B. Sullivan

It is certified that error appears in the above-identified patent and that said Letters Patent is hereby corrected as shown below:

Column 5, line 58: "tq" should be "to"
Column 6, line 4: w should be $\phi$
          line 8: w should be $\phi$
Column 7, line 61: insert = between $n^2$ and 2
Column 10, claim 2, line 57: K should be $K_1$ Signed and Sealed this Sixteenth Day of January, 1996

*Attest:*

BRUCE LEHMAN

*Attesting Officer*   *Commissioner of Patents and Trademarks*